(12) United States Patent
Takita et al.

(10) Patent No.: US 11,024,664 B2
(45) Date of Patent: Jun. 1, 2021

(54) IMAGING PANEL

(71) Applicant: SHARP KABUSHIKI KAISHA, Sakai (JP)

(72) Inventors: Rikiya Takita, Sakai (JP); Fumiki Nakano, Sakai (JP); Makoto Nakazawa, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 89 days.

(21) Appl. No.: 16/521,948

(22) Filed: Jul. 25, 2019

(65) Prior Publication Data
US 2020/0035746 A1 Jan. 30, 2020

Related U.S. Application Data

(60) Provisional application No. 62/712,078, filed on Jul. 30, 2018.

(51) Int. Cl.
*H01L 27/146* (2006.01)
*H01L 27/30* (2006.01)

(52) U.S. Cl.
CPC .. *H01L 27/14663* (2013.01); *H01L 27/14601* (2013.01); *H01L 27/14603* (2013.01); *H01L 27/14605* (2013.01); *H01L 27/14609* (2013.01); *H01L 27/14632* (2013.01); *H01L 27/14658* (2013.01); *H01L 27/307* (2013.01); *H01L 27/14692* (2013.01)

(58) Field of Classification Search
CPC ......... H01L 27/14601; H01L 27/14603; H01L 27/14605; H01L 27/14609; H01L 27/14632; H01L 27/14658; H01L 27/14663; H01L 27/14692; H01L 27/307
See application file for complete search history.

(56) References Cited

U.S. PATENT DOCUMENTS

| | | | | |
|---|---|---|---|---|
| 2009/0250699 | A1* | 10/2009 | Okada | H01L 27/1463 257/53 |
| 2011/0127593 | A1 | 6/2011 | Hayashi | |
| 2013/0140568 | A1* | 6/2013 | Miyamoto | H01L 31/0248 257/53 |
| 2019/0237692 | A1* | 8/2019 | Nakazawa | H01L 51/448 |
| 2019/0302282 | A1* | 10/2019 | Moriwaki | H01L 27/14663 |
| 2019/0302283 | A1* | 10/2019 | Moriwaki | H01L 27/14692 |
| 2019/0305025 | A1* | 10/2019 | Moriwaki | H01L 27/14663 |

FOREIGN PATENT DOCUMENTS

JP 2011-114310 A 6/2011

\* cited by examiner

*Primary Examiner* — Mark R Gaworecki
(74) *Attorney, Agent, or Firm* — ScienBiziP, P.C.

(57) ABSTRACT

An imaging panel includes an active matrix substrate that has a plurality of pixels each provided with a photoelectric conversion element, and the pixels each include a first electrode provided at a first surface of the photoelectric conversion element, a first flattening film provided above the photoelectric conversion element and the first electrode, and a bias conductive part provided below the first flattening film. The bias conductive part is connected to the first electrode and applies bias voltage to the first electrode. The first flattening film has no opening in a region overlapped with a pixel region.

7 Claims, 11 Drawing Sheets

IMAGING PANEL

TECHNICAL FIELD

The invention disclosed hereinafter relates to an imaging panel.

BACKGROUND ART

There has been conventionally proposed a technique for decrease of leakage current of a photoelectric conversion element in an X-ray imaging device including an active matrix substrate having pixels each provided with a switching element and the photoelectric conversion element. JP 2011-114310 A discloses a photovoltaic device including a compound layer protecting a portion, protruding from an upper electrode, in an upper surface of a photoelectric conversion layer. The photoelectric conversion layer is formed through etching an amorphous silicon layer and patterning, after provision of the compound layer covering the portion outside the upper electrode on the amorphous silicon layer. Provision of the compound layer reduces damage to the photoelectric conversion layer by ashing executed after etching, to decrease leakage current of a photodiode.

The X-ray imaging device may include a bias line provided above a flattening film positioned above the photodiode and configured to supply bias voltage, and the flattening film may have a contact hole allowing connection between the bias line and the upper electrode of the photodiode. Permeation of moisture to the flattening film is likely to allow entry of the moisture to the photodiode via the contact hole provided in the flattening film in this case. This is likely to cause a flow of leakage current of the photodiode to increase the leakage current.

SUMMARY OF INVENTION

In order to solve the problems mentioned above, disclosed hereinafter is an imaging panel including an active matrix substrate having a pixel region provided with a plurality of pixels each including a photoelectric conversion element, in which the active matrix substrate includes, in each of the pixels, a first electrode provided at a first surface of the photoelectric conversion element, a first flattening film provided above the photoelectric conversion element and the first electrode, and a bias conductive part connected to the first electrode and configured to apply bias voltage to the first electrode, the bias conductive part is provided below the first flattening film, and the first flattening film has no opening disposed in a region overlapped with the pixel region in a planar view.

The above configuration decreases entry of moisture to the imaging panel.

DESCRIPTION OF EMBODIMENTS

Figure 1:
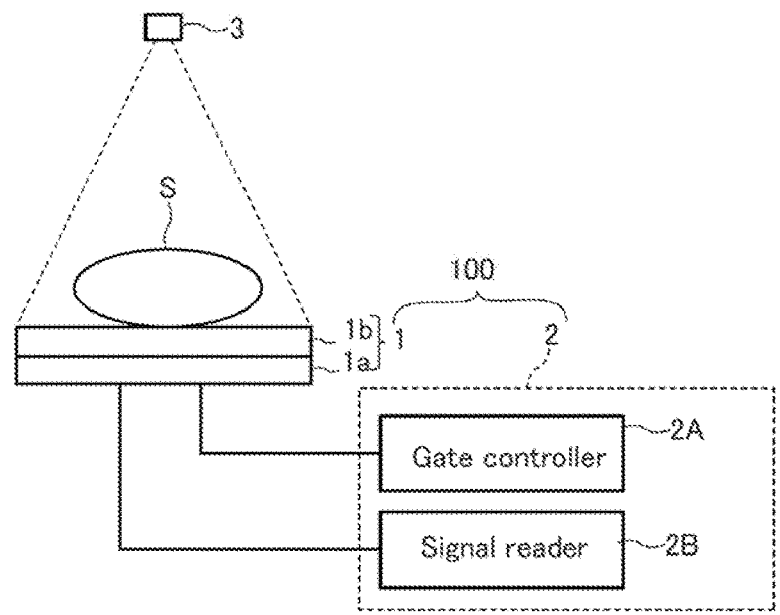
FIG. 1 is a pattern diagram of an X-ray imaging device according to a first embodiment.

Embodiments of the present invention will now be described in detail with reference to the drawings. Identical or corresponding parts in the drawings will be each denoted by an identical reference sign and will not be described repeatedly.

First Embodiment (Configuration)

FIG. 1 is a pattern diagram of an X-ray imaging device including an imaging panel according to the present embodiment. An X-ray imaging device 100 includes an imaging panel 1 having an active matrix substrate 1*a* and a scintillator 1*b*, as well as a controller 2.

The controller 2 includes a gate controller 2A and a signal reader 2B. There is provided an X-ray source 3 configured to apply X-rays to a shooting target S. The X-rays having been transmitted through the shooting target S are converted to fluorescence (hereinafter, referred to as scintillation light) by the scintillator 1*b* disposed above the active matrix substrate 1*a*. The X-ray imaging device 100 captures the scintillation light by means of the imaging panel 1 and the controller 2 to obtain an X-ray image.

Figure 2:
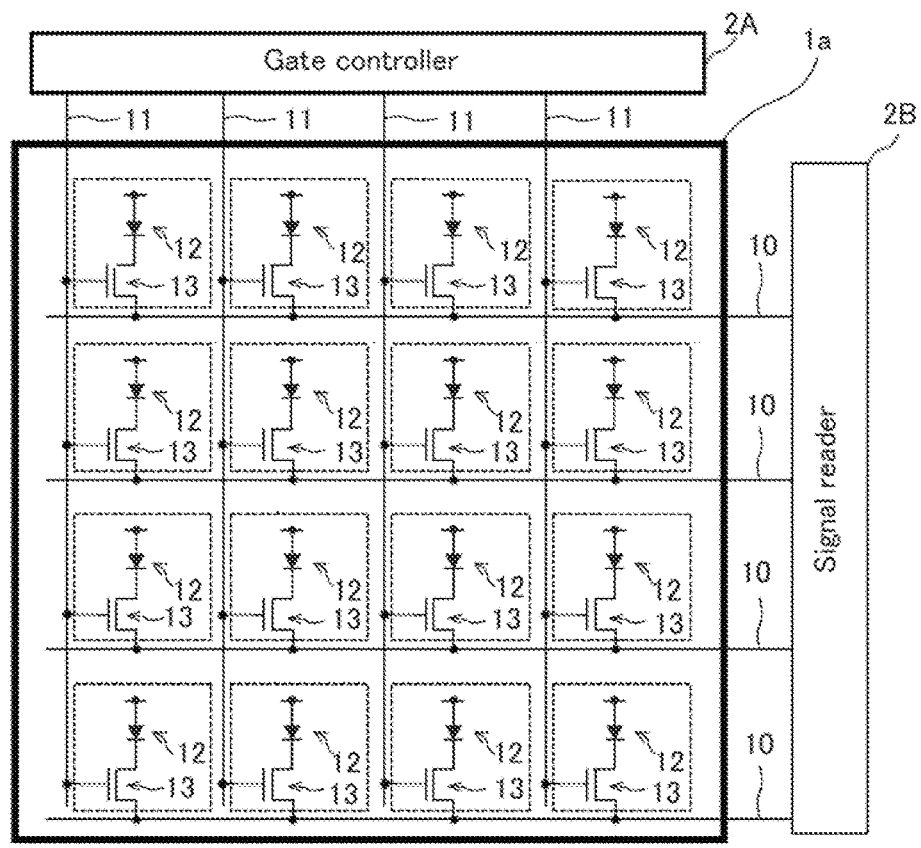
FIG. 2 is a pattern diagram showing a schematic configuration of an active matrix substrate in FIG. 1.

FIG. 2 is a pattern diagram showing a schematic configuration of the active matrix substrate 1*a*. As shown in FIG. 2, the active matrix substrate 1*a* has a plurality of source lines 10 and a plurality of gate lines 11 crossing the source lines 10. The gate lines 11 are connected to the gate controller 2A whereas the source lines 10 are connected to the signal reader 2B.

The active matrix substrate 1*a* includes TFTs 13 positioned at intersections between the source lines 10 and the gate lines 11 and each connected to a corresponding one of the source lines 10 and a corresponding one of the gate lines 11. The source lines 10 and the gate lines 11 surround to define regions (hereinafter, referred to as pixels) that are each provided with a photodiode 12. The photodiode 12 in each of the pixels converts the scintillation light obtained through conversion from the X-rays having been transmitted through the shooting target S to electric charge according to quantity of the scintillation light.

The gate lines 11 provided at the active matrix substrate 1*a* are sequentially switched into a selected state by the gate controller 2A, and the TFT 13 connected to the gate line 11 in the selected state is brought into an ON state. When the TFT 13 comes into the ON state, a signal according to the electric charge obtained through conversion by the photodiode 12 is transmitted to the signal reader 2B via the source line 10.

Figure 3:
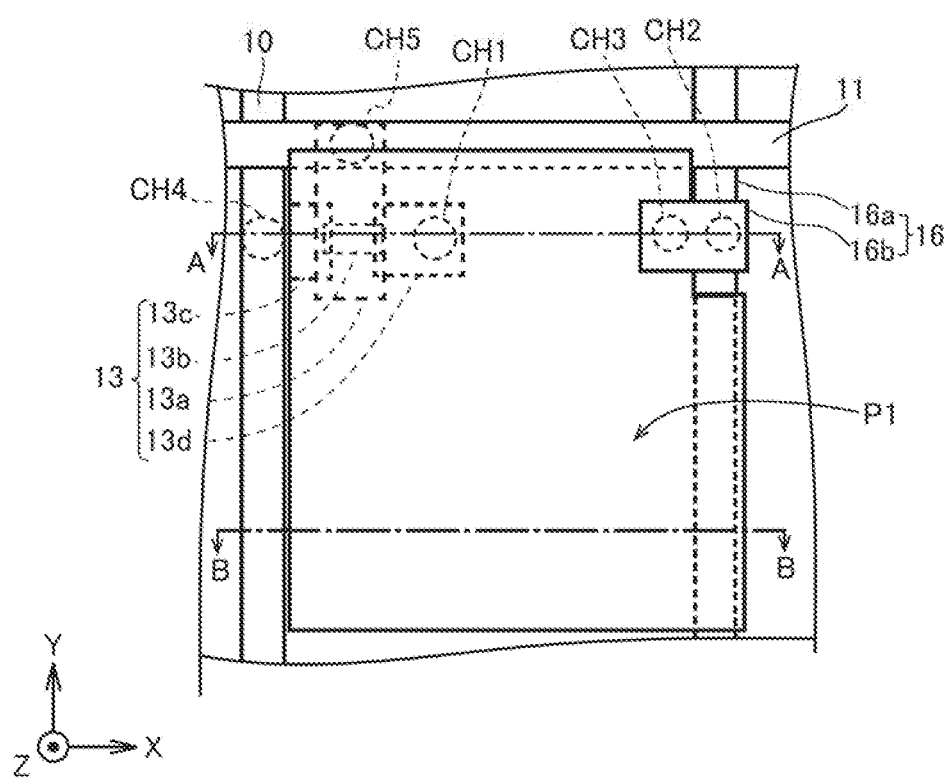
FIG. 3 is an enlarged partial plan view of a pixel part provided with a pixel on the active matrix substrate shown in FIG. 2.
Figure 4A:
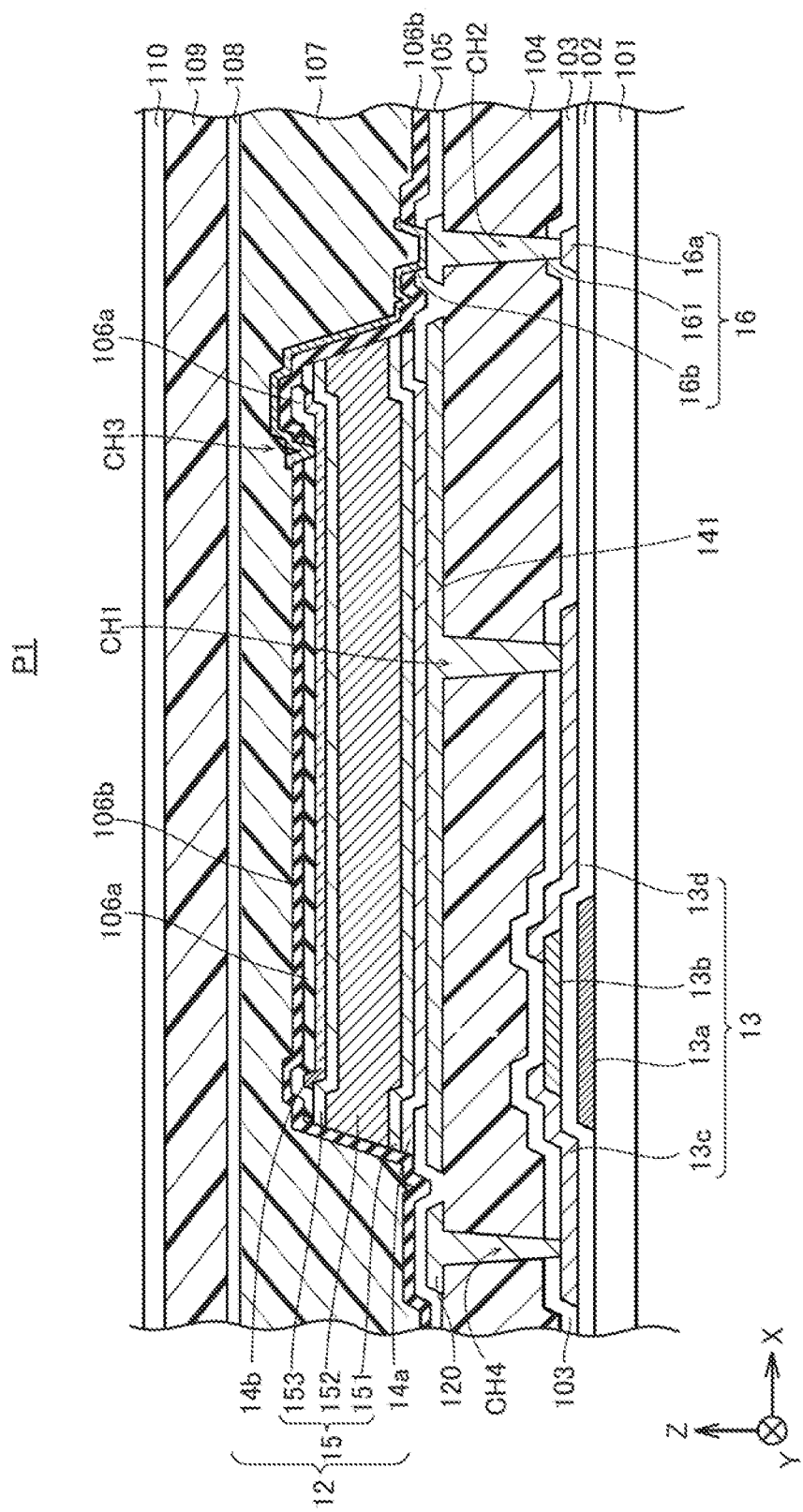
FIG. 4A is a sectional view taken along line A-A of the pixel part shown in FIG. 3.

FIG. 3 is an enlarged plan view of part of the pixels on the active matrix substrate 1a shown in FIG. 2. FIG. 4A depicts a section taken along line A-A indicated in FIG. 3.

The active matrix substrate 1a has a pixel region provided with a plurality of pixels P1 shown in FIG. 3. The pixels P1 are each provided with the photodiode 12 and the TFT 13. Each of the pixels P1 is further provided with a bias conductive part 16 electrically connected to the photodiode 12. The bias conductive part 16 includes a bias line 16a disposed substantially in parallel with the source line 10, and a bias electrode 16b connected to the photodiode 12 via a contact hole CH3. The bias line 16a is connected to a bias terminal (not shown) provided outside the pixel region, and applies, to the photodiode 12 via the bias electrode 16b, bias voltage supplied from the controller 2 connected to the bias terminal.

The photodiode 12 includes a pair of electrodes 14a and 14b (see FIG. 4A), and a photoelectric conversion layer 15 (see FIG. 4A) provided between the pair of electrodes 14a and 14b. The TFT 13 includes a gate electrode 13a provided integrally with the gate line 11, a semiconductor active layer 13b, a source electrode 13c provided integrally with the source line 10, and a drain electrode 13d. The drain electrode 13d and the first electrode (hereinafter, a lower electrode) 14a of the photodiode 12 are connected to each other via a contact hole CH1, and the second electrode (hereinafter, an upper electrode) 14b is connected to the bias electrode 16b via the contact hole CH3.

The gate electrode 13a or the source electrode 13c may not necessarily be provided integrally with the gate line 11 or the source line 10, respectively. Alternatively, the gate electrode 13a and the gate line 11 may be disposed in different layers and be connected to each other via a contact hole. Furthermore, the source electrode 13c and the source line 10 may be disposed in different layers and be connected to each other via a contact hole.

In FIG. 3, the source line 10 is connected, via a contact hole CH4, to a source terminal (not shown) provided outside the pixel region, and the gate line 11 is connected, via a contact hole CH5, to a gate terminal (not shown) provided outside the pixel region. The source terminal and the gate terminal are individually connected to the controller 2 (see FIG. 1).

Each of the pixels P1 will be described specifically in terms of its sectional structure with reference to FIG. 4A. FIG. 4A depicts a substrate 101 provided thereabove with the gate electrode 13a and a gate insulating film 102. The substrate 101 has an insulation property and is configured as a glass substrate or the like.

The gate electrode 13a and the gate line 11 according to this example each have a layered structure including metal films made of tantalum nitride (TaN) and tungsten (W) in the mentioned order from below. The films made of tantalum nitride (TaN) and tungsten (W) are preferred to be about 30 nm and about 300 nm in thickness, respectively. Each of the gate electrode 13a and the gate line 11 is not limited to the above exemplification in terms of its configuration, but may alternatively have a single layer or a plurality of layers including at least two layers. Furthermore, each of the gate electrode 13a and the gate line 11 is not limited to the above exemplification in terms of its material and thickness.

The gate insulating film 102 covers the gate electrode 13a. The gate insulating film 102 according to this example has a layered structure including inorganic insulating films made of silicon nitride ($SiN_x$) and silicon dioxide ($SiO_2$) in the mentioned order from below. The films made of silicon nitride ($SiN_x$) and silicon dioxide ($SiO_2$) are preferred to be about 325 nm and about 10 nm in thickness, respectively. The gate insulating film 102 is not limited to the above exemplification in terms of its configuration, but may alternatively have a single layer or a plurality of layers including at least two layers. Furthermore, the gate insulating film 102 is not limited to the above exemplification in terms of its material and thickness.

The gate electrode 13a is provided thereabove, while the gate insulating film 102 is interposed therebetween, with the semiconductor active layer 13b, the source electrode 13c and the drain electrode 13d connected to the semiconductor active layer 13b, and the bias line 16a.

The semiconductor active layer 13b is disposed in contact with the gate insulating film 102. The semiconductor active layer 13b is made of an oxide semiconductor. The semiconductor active layer 13b according to this example is made of an oxide semiconductor containing indium (In), gallium (Ga), zinc (Zn), and oxygen (O) at predetermined ratios.

Examples of the oxide semiconductor configuring the semiconductor active layer 13b may further include an oxide semiconductor containing $InGaO_3(ZnO)_5$, a magnesium zinc oxide ($Mg_xZn_{1-x}O$), a cadmium zinc oxide ($Cd_xZn_{1-x}O$), cadmium oxide (CdO), InSnZnO (containing In(indium), Sn (tin), and Zn (zinc)), an oxide semiconductor having an In (indium)-Al (aluminum)-Zn (zinc)-O (Oxygen) system, and an amorphous oxide semiconductor containing indium (In), gallium (Ga), and zinc (Zn) at predetermined ratios. The oxide semiconductor may alternatively be made of a "noncrystalline" or "crystalline (inclusive of polycrystal, microcrystalline, and c-axially oriented)" material. The semiconductor active layer 13b having a layered structure may adopt any combination in the above exemplification.

Adopting the oxide semiconductor described above enables decrease in off-leakage current of the TFT 13 in comparison to amorphous silicon (a-Si).

The source electrode 13c and the drain electrode 13d are disposed above the gate insulating film 102 and are in contact with part of the semiconductor active layer 13b. The bias line 16a is disposed above the gate insulating film 102, opposes the source electrode 13c with the drain electrode 13d interposed therebetween, and is spaced apart from the drain electrode 13d.

Each of the source electrode 13c, the drain electrode 13d, and the bias line 16a has a layered structure including metal films made of titanium (Ti), aluminum (Al), and titanium (Ti) in the mentioned order. These metal films are preferred to be about 30 nm, about 400 nm, and about 50 nm in thickness in the mentioned order from below. Each of the source electrode 13c, the drain electrode 13d, and the bias line 16a is not limited to the above exemplification in terms of its structure, but may alternatively have a single layer or a layered structure provided with at least two layers. Furthermore, each of the source electrode 13c, the drain electrode 13d, and the bias line 16a is not limited to the above exemplification in terms of its material and thickness.

The gate insulating film 102 is provided thereabove with an insulating film 103 covering the source electrode 13c, the drain electrode 13d, and the bias line 16a, as well as a flattening film 104 covering the insulating film 103.

The insulating film 103 according to this example has a layered structure including inorganic insulating films made of silicon dioxide ($SiO_2$) and silicon nitride (SiN) in the mentioned order from below. The inorganic insulating films made of silicon dioxide ($SiO_2$) and silicon nitride (SiN) are about 500 nm and about 150 nm in thickness, respectively. The insulating film 103 is not limited to the above exemplification in terms of its structure but may alternatively have a single layer or a plurality of layers including at least two layers. The insulating film 103 configured by a single layer is preferred to be made of silicon dioxide (SiO$_2$). Furthermore, the insulating film 103 is not limited to the above exemplification in terms of its material and thickness.

The flattening film 104 according to this example is configured as an organic insulating film made of a photosensitive resin. The flattening film 104 is preferred to be about 2500 nm in thickness. The flattening film 104 is not limited to the above exemplification in terms of its configuration.

The source electrode 13c, the drain electrode 13d, and the bias line 16a are provided thereabove with contact holes CH4, CH1, and CH2, respectively, which penetrate the insulating film 103 and the flattening film 104.

The flattening film 104 is provided thereabove with a lower electrode connecting part 141 connected to the drain electrode 13d, a bias line connecting part 161 connected to the bias line 16a, and a source connecting part 120 connected to the source electrode 13c of the TFT 13.

The lower electrode connecting part 141 is provided above the contact hole CH1 and is connected to the drain electrode 13d via the contact hole CH1. The bias line connecting part 161 is provided above the contact hole CH2 and is connected to the bias line 16a via the contact hole CH2. The source connecting part 120 is provided above the contact hole CH4 and is connected to the source electrode 13c via the contact hole CH4. The source connecting part 120 is connected to the source terminal (not shown).

Each of the lower electrode connecting part 141, the bias line connecting part 161, and the source connecting part 120 according to this example has a layered structure including metal films made of titanium (Ti), aluminum (Al), and titanium (Ti) in the mentioned order. These metal films are preferred to be about 30 nm, about 300 nm, and about 100 nm in thickness in the mentioned order from below. Each of the lower electrode connecting part 141, the bias line connecting part 161, and the source connecting part 120 is not limited to the above exemplification in terms of its structure, but may alternatively have a layered structure including a plurality of metal films. Furthermore, each of the lower electrode connecting part 141, the bias line connecting part 161, and the source connecting part 120 is not limited to the above exemplification in terms of its thickness.

The flattening film 104 is provided thereabove with an insulating film 105 that covers a surface of the source connecting part 120 and is separated above the lower electrode connecting part 141 and the bias line connecting part 161. The insulating film 105 is not positioned to be overlapped with the contact hole CH1 or the contact hole CH2 in a planar view, but is positioned outside the contact hole CH1 and the contact hole CH2 above the lower electrode connecting part 141 and the bias line connecting part 161.

The insulating film 105 according to this example is configured as an inorganic insulating film made of silicon nitride (SiN). The insulating film 105 is preferred to be about 300 nm in thickness. The insulating film 105 is not limited to the above exemplification in terms of its structure, but may alternatively have a layered structure including a plurality of inorganic insulating films. Furthermore, the insulating film 105 is not limited to the above exemplification in terms of its material and thickness.

The lower electrode connecting part 141 is provided thereabove with the lower electrode 14a covering a separated portion of the insulating film 105. The lower electrode 14a according to this example is configured by a metal film made of titanium (Ti). The lower electrode 14a is preferred to be about 50 nm in thickness. The lower electrode 14a is not limited to the above exemplification in terms of its structure, but may alternatively have a layered structure including a plurality of metal films. Furthermore, the lower electrode 14a is not limited to the above exemplification in terms of its thickness.

The lower electrode 14a is provided thereabove with the photoelectric conversion layer 15 including an n-type noncrystalline semiconductor layer 151, an intrinsic noncrystalline semiconductor layer 152, and a p-type noncrystalline semiconductor layer 153 layered in the mentioned order.

The n-type noncrystalline semiconductor layer 151 is made of amorphous silicon doped with an n-type impurity (e.g. phosphorus).

The intrinsic noncrystalline semiconductor layer 152 is made of intrinsic amorphous silicon. The intrinsic noncrystalline semiconductor layer 152 is provided in contact with the n-type noncrystalline semiconductor layer 151.

The p-type noncrystalline semiconductor layer 153 is made of amorphous silicon doped with a p-type impurity (e.g. boron). The p-type noncrystalline semiconductor layer 153 is provided in contact with the intrinsic noncrystalline semiconductor layer 152.

The n-type noncrystalline semiconductor layer 151, the intrinsic noncrystalline semiconductor layer 152, and the p-type noncrystalline semiconductor layer 153 according to this example are preferred to be about 10 nm, about 1200 nm, and about 10 nm in thickness, respectively. Each of the n-type noncrystalline semiconductor layer 151, the intrinsic noncrystalline semiconductor layer 152, and the p-type noncrystalline semiconductor layer 153 is not limited to the above exemplification in terms of its dopant and thickness.

The p-type noncrystalline semiconductor layer 153 is provided thereabove with the upper electrode 14b. The upper electrode 14b is disposed inside an end of the photoelectric conversion layer 15. The upper electrode 14b is shorter than the photoelectric conversion layer 15 in an X-axis direction. The upper electrode 14b is exemplarily configured by a transparent conductive film made of indium tin oxide (ITO). The upper electrode 14b is preferred to be about 60 nm in thickness. Furthermore, the upper electrode 14b is not limited to the above exemplification in terms of its material and thickness.

The p-type noncrystalline semiconductor layer 153 is provided thereabove with an insulating film 106a covering the upper electrode 14b. The insulating film 105 is provided thereabove with an insulating film 106b covering the insulating film 106a. The contact hole CH3 is provided above the upper electrode 14b and penetrates the insulating film 106a and the insulating film 106b. The insulating film 106b covers the insulating film 105 from above, and covers the photoelectric conversion layer 15 and a side surface of the lower electrode 14a.

The insulating film 106b and the insulating film 105 are each separated above the contact hole CH2. The contact hole CH3 is positioned above the upper electrode 14b and penetrates the insulating film 106a and the insulating film 106b.

The insulating film 106a and the insulating film 106b according to this example are each configured as an inorganic insulating film made of silicon nitride (SiN). The insulating film 106a is preferred to be about 50 nm in thickness, whereas the insulating film 106b is preferred to be about 250 nm in thickness. Furthermore, each of the insulating film 106a and the insulating film 106b is not limited to the above exemplification in terms of its material and thickness.

The insulating film 106b is provided thereabove with the bias electrode 16b that extends across the contact hole CH3 and the contact hole CH2 in a planar view. The bias electrode 16b is connected to the upper electrode 14b in the contact hole CH3. The bias electrode 16b is further connected to the bias line connecting part 161 provided in the contact hole CH2.

The bias electrode 16b according to this example is configured by a transparent conductive film made of ITO. The bias electrode 16b is preferred to be about 100 nm in thickness. Furthermore, the bias electrode 16b is not limited to the above exemplification in terms of its material and thickness.

The insulating film 106b and the bias electrode 16b are covered with a flattening film 107. The flattening film 107 according to this example is configured as an organic insulating film made of a photosensitive resin. The flattening film 107 is preferred to be about 2500 nm in thickness. The flattening film 107 is not limited to the above exemplification in terms of its structure. The flattening film 107 is provided continuously at least all over the pixel region and has no opening such as a contact hole in the pixel region.

The flattening film 107 is covered with an insulating film 108. The insulating film 108 according to this example is configured as an inorganic insulating film made of silicon nitride (SiN). The insulating film 108 is preferred to be about 300 nm in thickness. The insulating film 108 is not limited to the above exemplification in terms of its structure.

The insulating film 108 is covered with a flattening film 109. The flattening film 109 according to this example is configured as an organic insulating film made of a photosensitive resin. The flattening film 109 is preferred to be about 3000 nm in thickness. The flattening film 109 is not limited to the above exemplification in terms of its structure.

The flattening film 109 is covered with an insulating film 110. The insulating film 110 according to this example is configured as an inorganic insulating film made of silicon nitride (SiN). The insulating film 110 is preferred to be about 150 nm in thickness. The insulating film 110 is not limited to the above exemplification in terms of its structure.

The active matrix substrate 1a has the sectional structure described above in the single pixel P1. Though not shown, the imaging panel 1 has the scintillator 1b (see FIG. 1) provided above the insulating film 110.

(Operation of X-Ray Imaging Device 100)

The X-ray imaging device 100 shown in FIG. 1 will be described below in terms of its operation. The X-ray source 3 initially emits X-rays. The controller 2 applies predetermined voltage (bias voltage) to the bias line 16a (see FIG. 3 and the like) in this case. The X-rays emitted from the X-ray source 3 are transmitted through the shooting target S and enter the scintillator 1b. The X-rays having entered the scintillator 1b are converted to fluorescence (scintillation light) that subsequently enters the active matrix substrate 1a. When the scintillation light enters the photodiode 12 provided at each of the pixels on the active matrix substrate 1a, the photodiode 12 converts the scintillation light to electric charge according to quantity of the scintillation light. When the TFT 13 (see FIGS. 2, 3, and the like) is in the ON state in accordance with gate voltage (positive voltage) transmitted from the gate controller 2A via the gate line 11, the signal reader 2B (see FIG. 2 and the like) reads, via the source line 10, a signal according to the electric charge obtained through conversion by the photodiode 12. The controller 2 then generates an X-ray image according to the read signal.

The bias line 16a according to the first embodiment described above is provided below the photodiode 12. The upper electrode 14b of the photodiode 12 and the bias line 16a are connected to each other via the bias electrode 16b and the bias line connecting part 161 disposed below the flattening film 107 positioned above the photodiode 12. The upper electrode 14b and the bias line 16a can be connected to each other with no penetration of the flattening film 107 positioned above the photodiode 12.

In a tentative case where the bias line 16a is provided above the flattening film 107 and is connected to the upper electrode 14b from above the photodiode 12, the flattening film 107 needs to have a contact hole allowing connection between the bias line 16a and the upper electrode 14b. Permeation of moisture to the flattening film 107 is likely to allow entry of the moisture to the photodiode 12 via the contact hole in this case.

The first embodiment provides no contact hole in the flattening film 107 disposed above the photodiode 12, and the flattening film 107 extends continuously in the entire pixel region. Permeation of moisture to the flattening film 109 is thus less likely to allow entry of the moisture to the photodiode 12 via the flattening film 107.

The flattening film 107 according to the first embodiment is provided thereabove with the insulating film 108 configured as an inorganic insulating film. Even in a case where moisture permeates the flattening film 109, the moisture is less likely to enter the flattening film 107 via the insulating film 108.

Figure 4B:
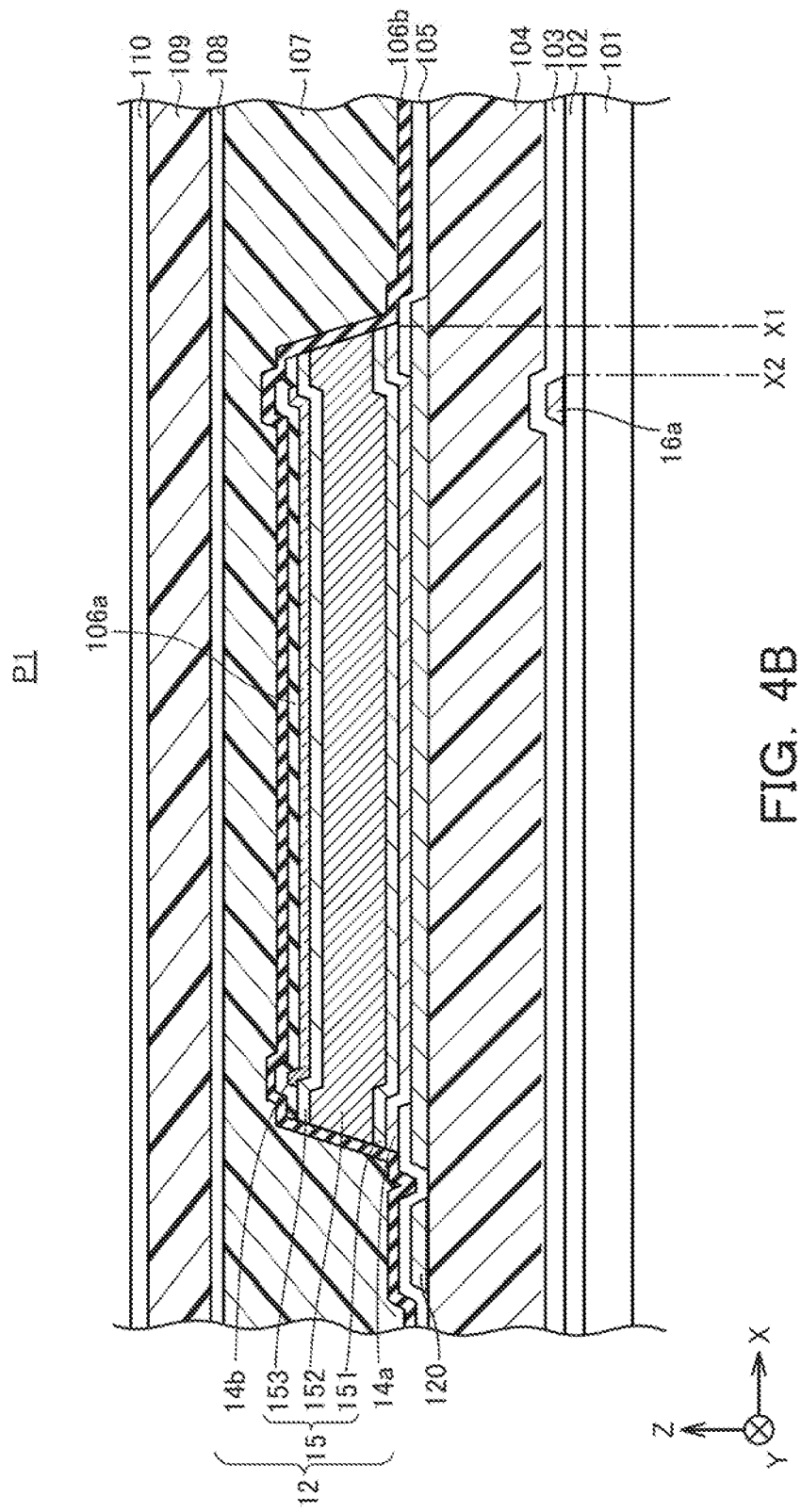
FIG. 4B is a sectional view taken along line B-B of the pixel part shown in FIG. 3.

Furthermore, the bias line 16a provided below the lower electrode 14a of the photodiode 12 enables increase in area of the photodiode 12 in comparison to another case where the bias line 16a is provided equally in level with or above the lower electrode 14a of the photodiode 12. FIG. 4B is a sectional view of the pixel P1 taken along line B-B indicated in FIG. 3. As shown in FIG. 4B, the photodiode 12 has an end in the X-axis direction at a position X1 shifted positively along the X-axis from a position X2 of an end in the X-axis direction of the bias line 16a.

In the case where the bias line 16a is provided equally in level with or above the lower electrode 14a, the photodiode 12 is disposed inside the bias line 16a in the pixel P so as not to be overlapped with the bias line 16a in a planar view. The bias line 16a provided below the lower electrode 14a of the photodiode 12 can thus enable increase in area of the photodiode 12 and improvement in quantum efficiency (QE) of the photodiode 12.

Second Embodiment

Figure 5:
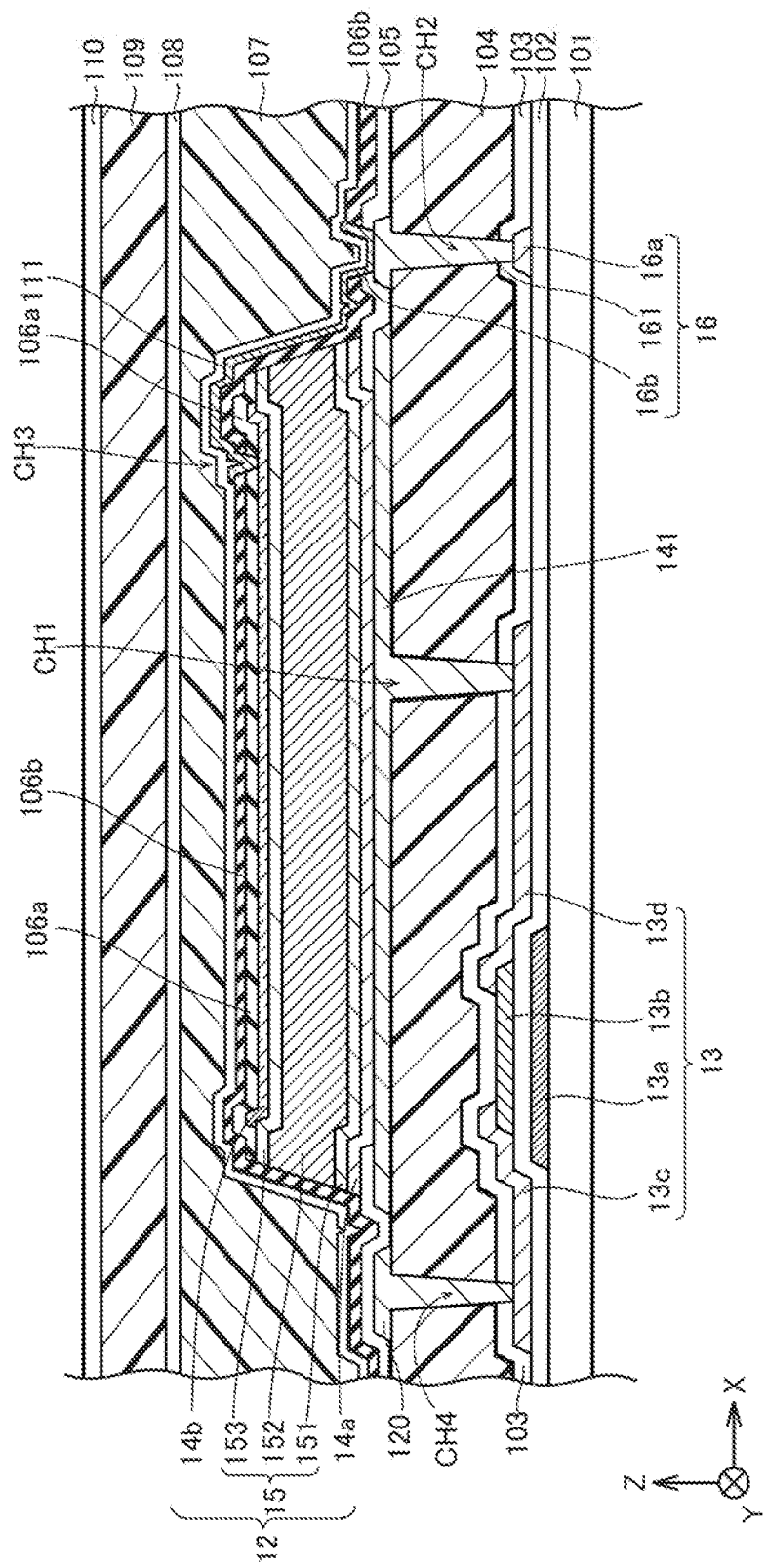
FIG. 5 is a sectional view of a pixel part according to a second embodiment.

FIG. 5 is a sectional view, taken along line A-A (see FIG. 3), of the pixel P1 according to the present embodiment. FIG. 5 includes components that are similar to those according to the first embodiment and are denoted by reference signs identical to those of the first embodiment. Components different from those according to the first embodiment will be described below.

As shown in FIG. 5, the active matrix substrate 1a according to the present embodiment is different from the active matrix substrate according to the first embodiment in that the pixel P1 is provided with an insulating film 111 covering the bias electrode 16b and the insulating film 106b. The insulating film 111 is provided all over the pixel region.

The flattening film 107 is disposed above the insulating film 111 to entirely cover the insulating film 111.

The insulating film 111 according to this example is configured as an inorganic insulating film made of silicon nitride (SiN). The insulating film 111 is preferred to be about 150 nm to 400 nm in thickness. The insulating film 111 is not limited to the above exemplification in terms of its structure.

Such provision of the insulating film 111 below the flattening film 107 in the entire pixel region achieves further decrease of entry of moisture to the photodiode 12 and the TFT 13 via the contact hole CH2 or CH3 in comparison to the case where the insulating film 111 is not provided.

Third Embodiment

Figure 6:
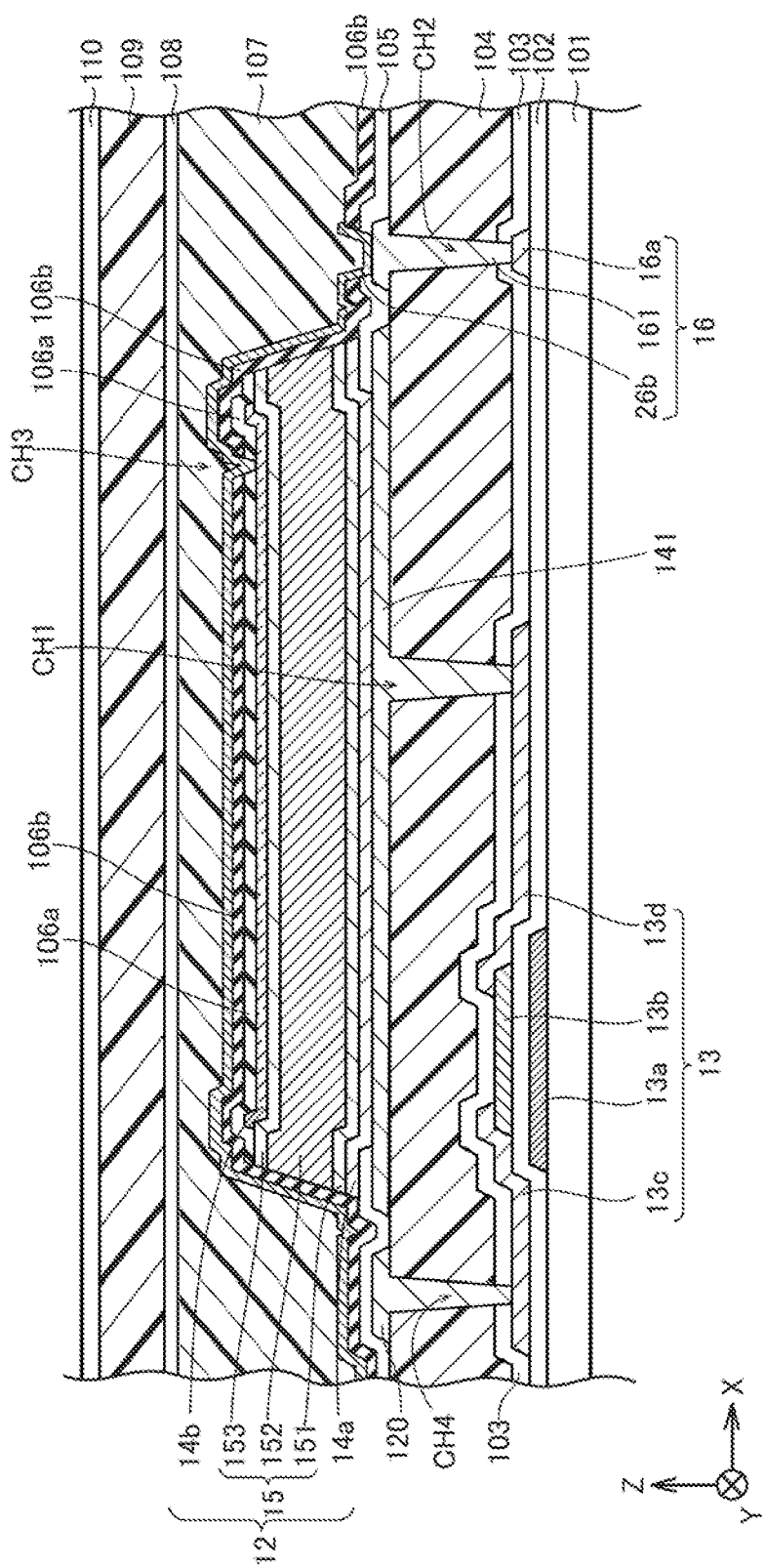
FIG. 6 is a sectional view of a pixel part according to a third embodiment.

FIG. 6 is a sectional view, taken along line A-A (see FIG. 3), of the pixel P1 according to the present embodiment. FIG. 6 includes components that are similar to those according to the first embodiment and are denoted by reference signs identical to those of the first embodiment. Components different from those according to the first embodiment will be described below.

As shown in FIG. 6, the active matrix substrate 1a according to the present embodiment is different from the active matrix substrate according to the first embodiment in that the pixel P1 includes a bias electrode 26b that is disposed above the insulating film 106a, extends between the contact hole CH2 and the contact hole CH3 in a planar view, and entirely covers the insulating film 106a covering the photodiode 12.

The bias electrode 26b is configured by a transparent conductive film made of ITO or the like so as to exhibit higher damp proofness than an inorganic insulating film made of silicon nitride (SiN) or silicon dioxide ($SiO_2$). The bias electrode 26b covering the photodiode 12 from above more effectively decreases entry of moisture to the photodiode 12 in comparison to the first embodiment.

Fourth Embodiment

Figure 7:
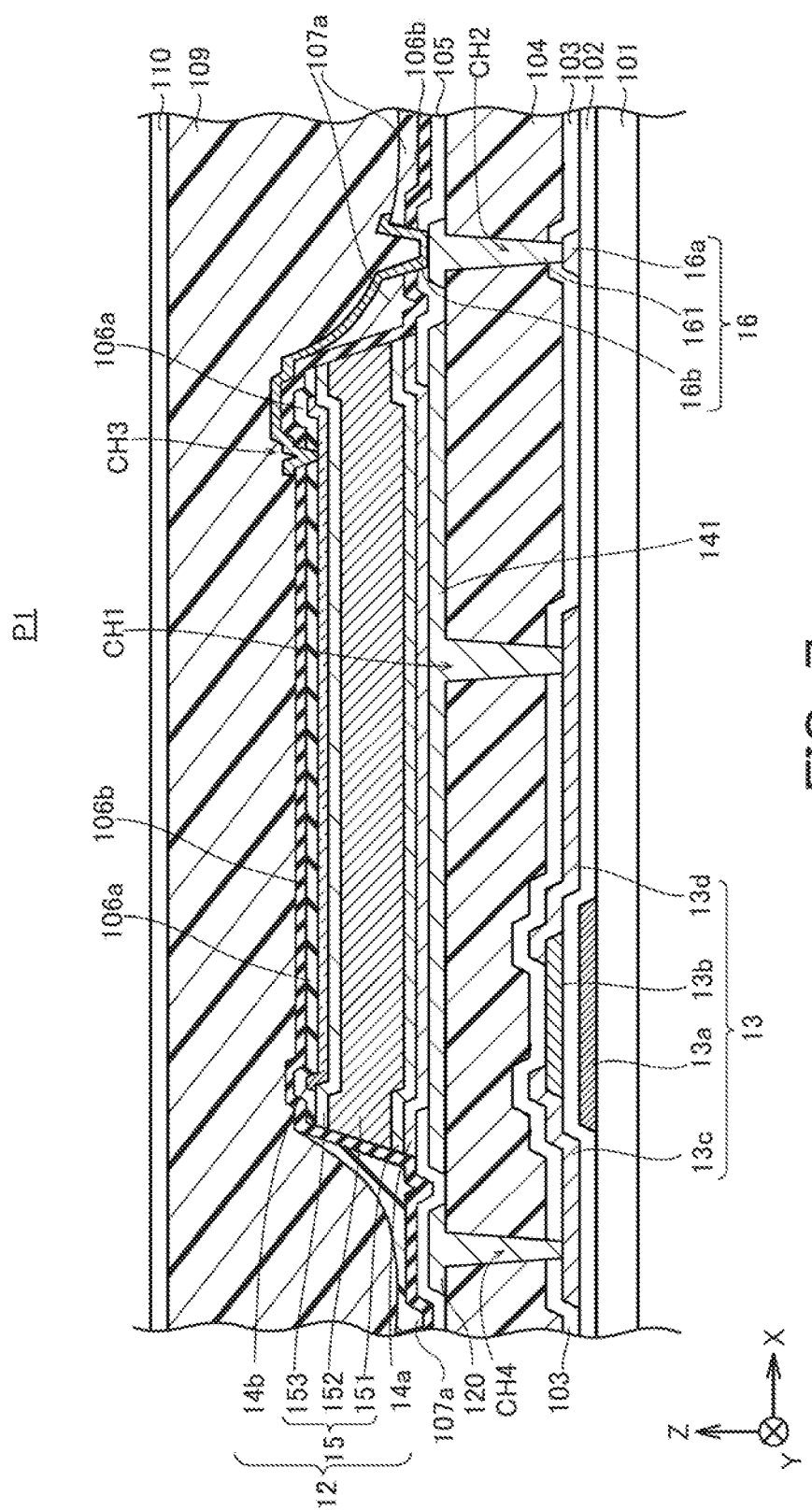
FIG. 7 is a sectional view of a pixel part according to a fourth embodiment.

FIG. 7 is a sectional view, taken along line A-A (see FIG. 3), of the pixel P1 according to the present embodiment. FIG. 7 includes components that are similar to those according to the first embodiment and are denoted by reference signs identical to those of the first embodiment. Components different from those according to the first embodiment will be described below.

As shown in FIG. 7, the active matrix substrate 1a according to the present embodiment is different from the active matrix substrate according to the first embodiment in that the insulating film 106b outside the end of the photodiode 12 is provided thereabove with an organic insulating film 107a disposed between the bias electrode 16b and the insulating film 106b. The active matrix substrate 1a according to the present embodiment has the flattening film 109 and the insulating film 110 each disposed above the bias electrode 16b. The present embodiment is different from the first embodiment in that the bias electrode 16b is provided thereabove with a single flattening film and a single inorganic insulating film.

The organic insulating film 107a is made of the photosensitive resin configuring the flattening film 107 according to the first embodiment.

The organic insulating film 107a is provided to be overlapped with the insulating film 106a covering a side surface of the photodiode 12 but is not provided at a position overlapped with the contact hole CH2 in a planar view. The bias electrode 16b is disposed above the organic insulating film 107a to extend across the contact holes CH3 and CH2 in a planar view.

Such provision of the insulating film 106a and the organic insulating film 107a between the side surface of the photodiode 12 and the bias electrode 16b prevents an electric short circuit between the bias electrode 16b and the photodiode 12. Provision of the organic insulating film 107a in the present embodiment leads to increase in distance between the photodiode 12 and the bias electrode 16b for prevention of an electric short circuit from the photoelectric conversion layer 15 and the lower electrode 14a to the bias electrode 16b.

Figure 8A:
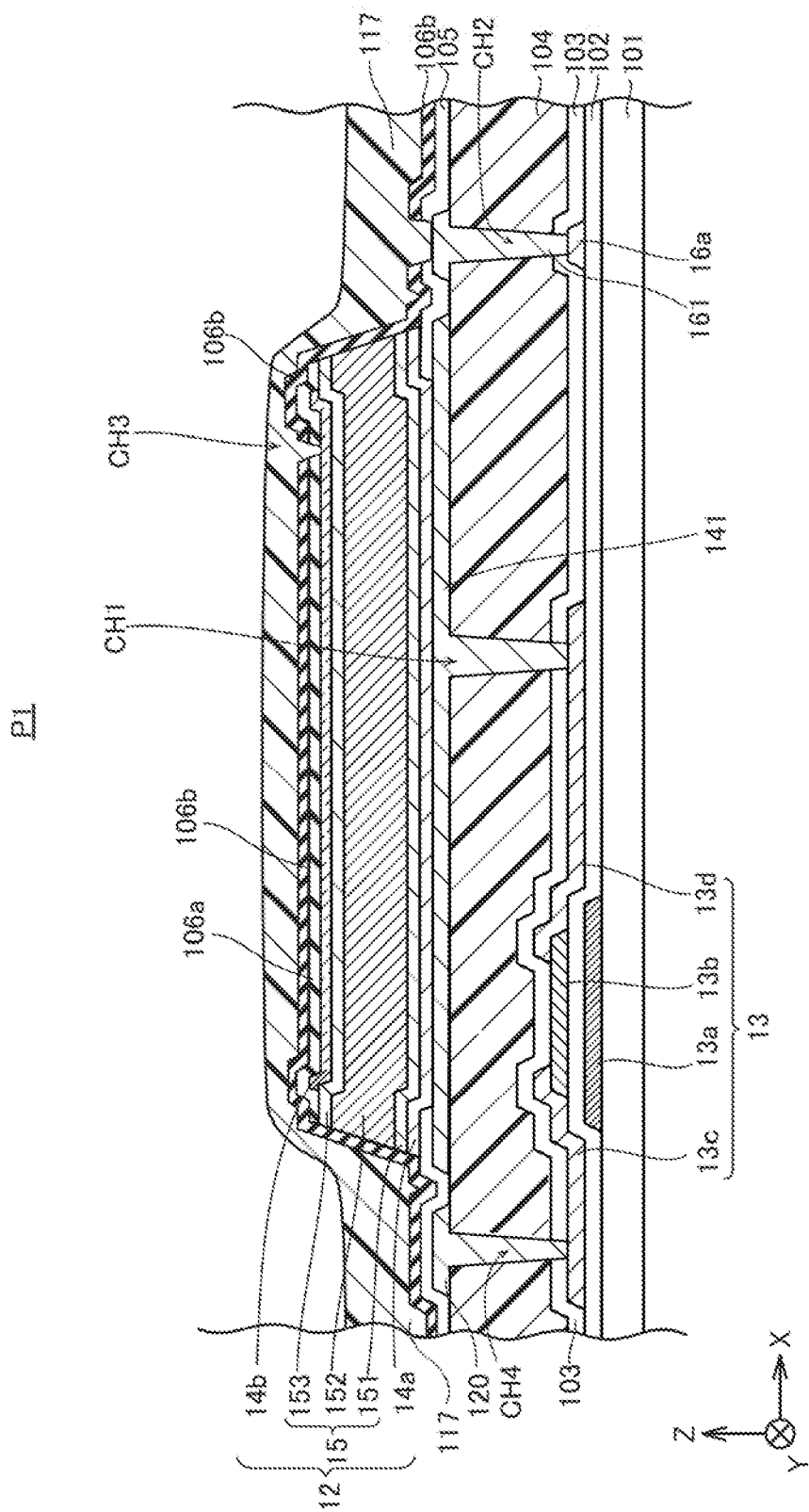
FIG. 8A is a sectional view showing a process of forming an organic insulating film 107*a* shown in FIG. 7.
Figure 8B:
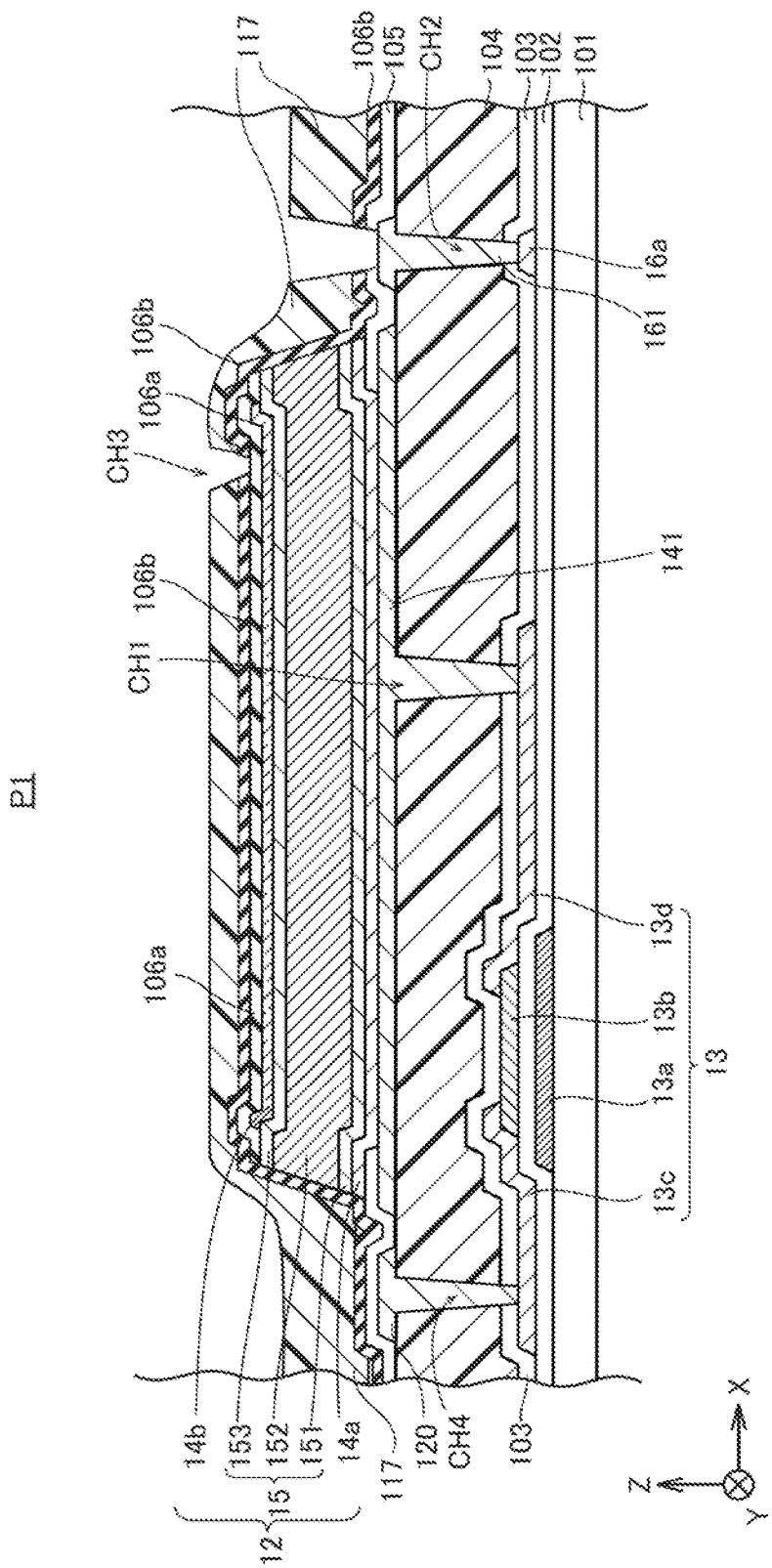
FIG. 8B is a sectional view showing another process of forming the organic insulating film 107*a* shown in FIG. 7.
Figure 8C:
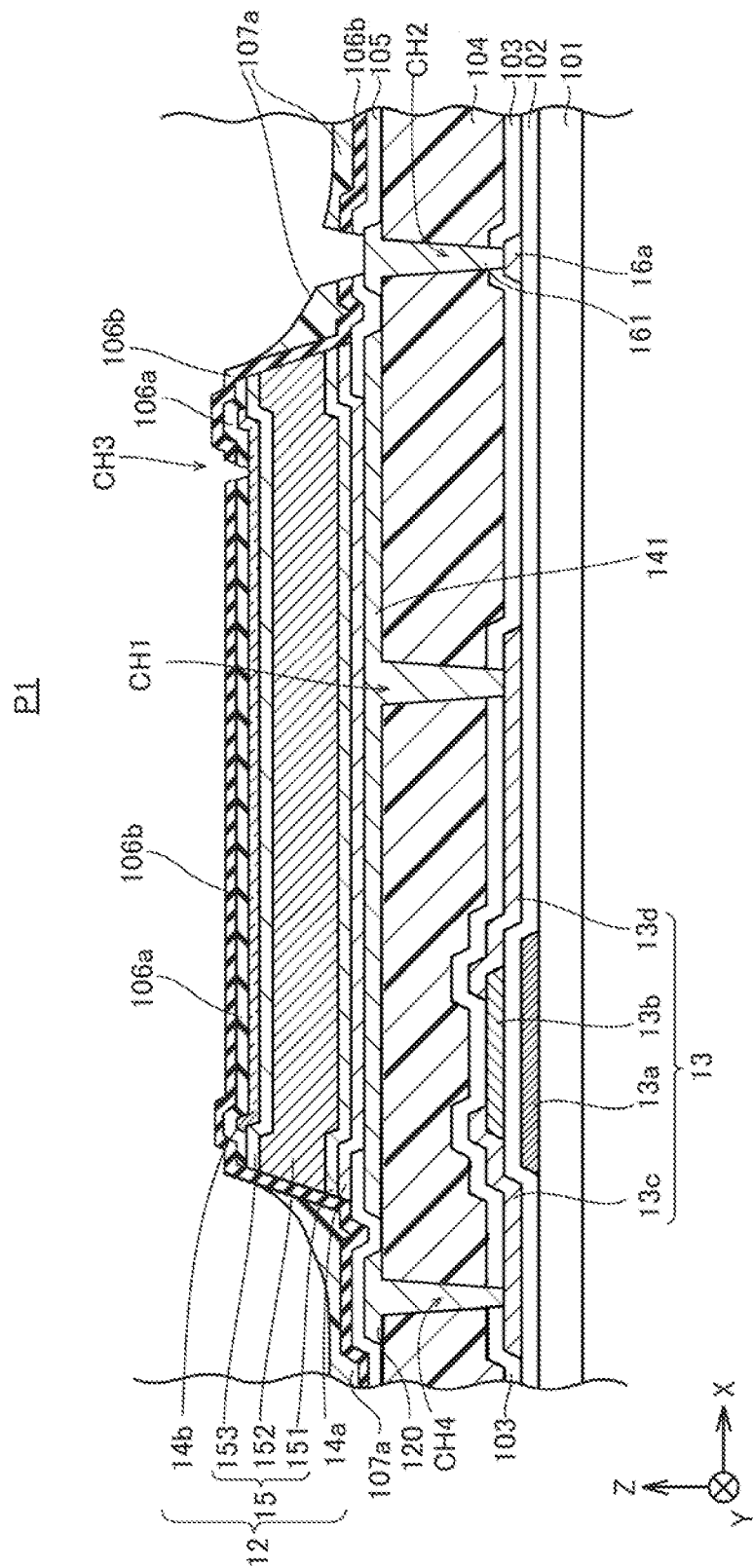
FIG. 8C is a sectional view showing still another process of forming the organic insulating film 107*a* shown in FIG. 7.

The organic insulating film 107a according to the present embodiment can be produced in the following manner. FIGS. 8A to 8C are sectional views explanatorily showing processes of forming the organic insulating film 107a.

In FIG. 8A, there is applied, in accordance with a slit coating method, an organic insulating film 117 made of a photosensitive resin and covering the insulating film 106b. The organic insulating film 117 thus provided is smaller in quantity than the flattening film 107 according to the first embodiment. The substrate 101 is then rotated at high speed to shift the organic insulating film 117 toward an end of the substrate 101 and gather the organic insulating film 117 near a bottom of the photodiode 12.

Photolithography and etching are subsequently executed to form openings in the organic insulating film 117 at positions overlapped with the contact holes CH2 and CH3 in a planar view (see FIG. 8B).

Ashing is then executed to remove the organic insulating film 117 above the photodiode 12 and thin the organic insulating film 117 so as to obtain the organic insulating film 107a (see FIG. 8C).

Fifth Embodiment

Figure 9:
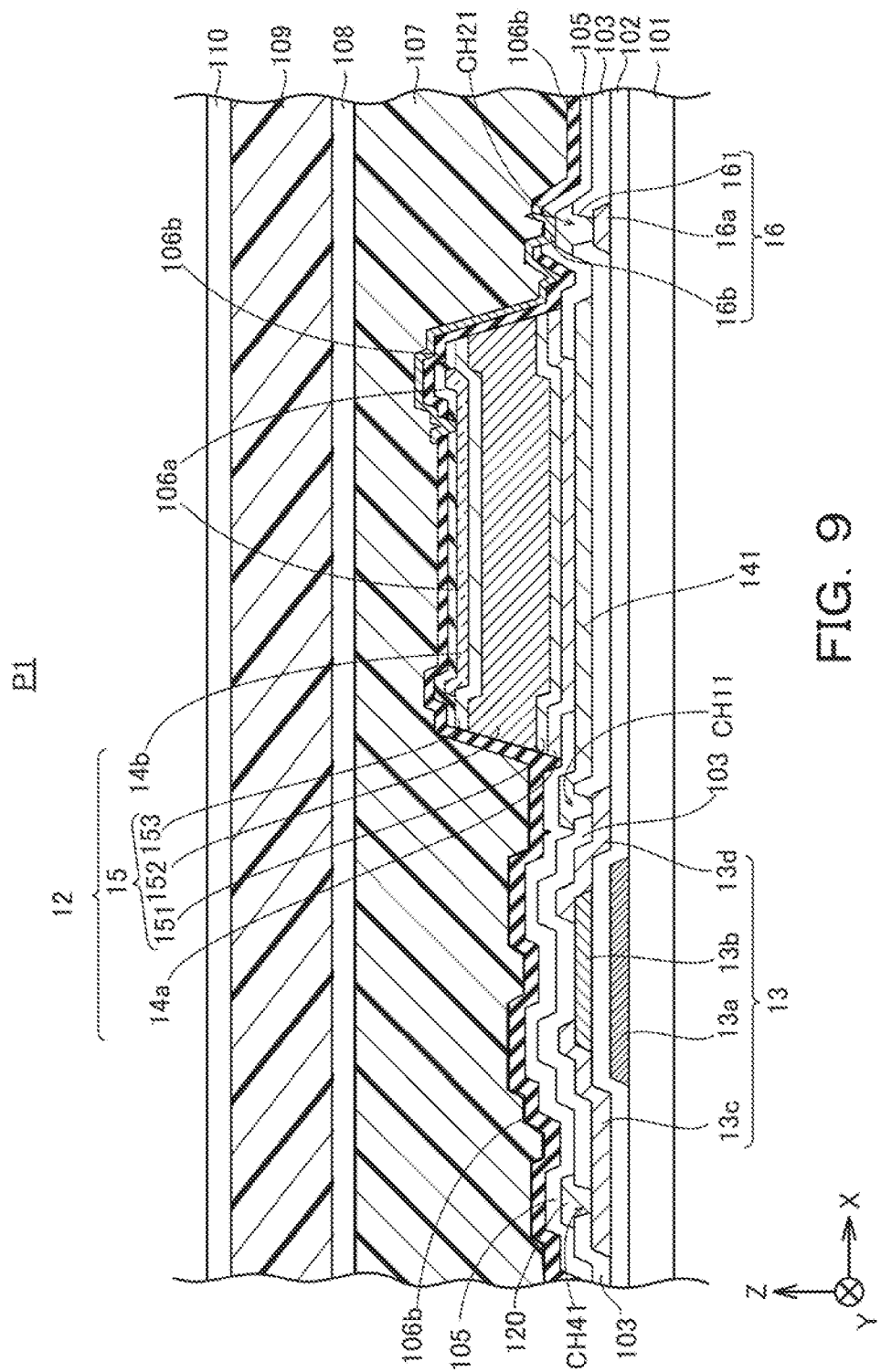
FIG. 9 is a sectional view of a pixel part according to a fifth embodiment.

FIG. 9 is a sectional view, taken along line A-A (see FIG. 3), of the pixel P1 according to the present embodiment. FIG. 9 includes components that are similar to those according to the first embodiment and are denoted by reference signs identical to those of the first embodiment. Components different from those according to the first embodiment will be described below.

As shown in FIG. 9, the active matrix substrate 1a according to the present embodiment is different from the active matrix substrate according to the first embodiment in that the lower electrode connecting part 141, the bias line connecting part 161, and the source connecting part 120 are provided not above the flattening film 104 but above the insulating film 103. The present embodiment excludes provision of the flattening film 104.

The insulating film 103 has contact holes CH11, CH21, and CH41 allowing the lower electrode connecting part 141, the bias line connecting part 161, and the source connecting part 120 to be connected to the drain electrode 13d, the bias line 16a, and the source electrode 13c, respectively.

Even in such a case where the photodiode 12 is not provided therebelow with any flattening film and is provided thereabove with only the two flattening films 107 and 109, the flattening film 107 or 109 has no contact hole allowing connection between the bias electrode 16b and the photodiode 12 as in the first embodiment. Entry of moisture to the flattening film 107 is thus less likely to allow entry of the moisture to the photodiode 12 or the TFT 13.

The X-ray imaging device according to each of the embodiments has been described above for mere exemplification. The X-ray imaging device should not be limited to any one of the above embodiments, but can be implemented with appropriate modifications to the above embodiments without departing from the spirit of the invention.

(1) The active matrix substrate 1a (see FIG. 6) according to the third embodiment may optionally be provided with the insulating film 111 (see FIG. 5) according to the second embodiment. Such a configuration more effectively decreases entry of moisture to the photodiode 12 in comparison to the third embodiment.

(2) The active matrix substrate 1a (see FIG. 9) according to the fifth embodiment may optionally be provided with the insulating film 111 (see FIG. 5) according to the second embodiment to cover the insulating film 106a and the bias electrode 16b. In the active matrix substrate 1a according to the fifth embodiment, the bias electrode 16b may entirely cover the insulating film 106a as in the third embodiment (see FIG. 6). The active matrix substrate 1a according to the fifth embodiment may not include the flattening film 107 but include the organic insulating film 107a (see FIG. 7) disposed between the bias electrode 16b and the insulating film 106a covering the side surface of the photodiode 12 as in the fourth embodiment. The configuration according to any one of the second to fourth embodiments may be combined with the active matrix substrate 1a according to the fifth embodiment as described above, or a plurality of configurations may be appropriately combined together.

(3) The first to fifth embodiments exemplify the case where the bias line 16a is provided equally in level with the source electrode 13c and the drain electrode 13d of the TFT 13. The bias line 16a may alternatively be provided equally in level with the gate electrode 13a of the TFT 13. The bias line 16a may still alternatively be provided above the flattening film 104. The bias line 16a provided above the flattening film 104 does not need the bias line connecting part 161 but can be connected directly to the bias electrode 16b.

(4) The first to fifth embodiments exemplify the case where the insulating film 106a covers an upper surface of the photodiode 12 and the insulating film 106b covers the insulating film 106a and a surface of the photodiode 12. These embodiments exemplify the case where the photodiode 12 is covered with the two inorganic insulating films. The surface of the photodiode 12 may alternatively be covered with a single inorganic insulating film.

(5) The first to fourth embodiments exemplify the case where the flattening film 109 and the insulating film 110 are provided above the insulating film 108. There may alternatively be provided neither the flattening film 109 nor the insulating film 110. Even in such a configuration, the insulating film 108 provided above the flattening film 107 is less likely to allow entry of moisture to the flattening film 107 to decrease entry of the moisture to the photodiode 12 via the flattening film 107. Entry of moisture is highly effectively decreased if the insulating film 108 is provided above the flattening film 107 in the active matrix substrate 1a. The flattening film 107 may alternatively be provided at least above the photodiode 12.

(6) The organic insulating film configuring the flattening film 104, 107, or 109 according to the first to fifth embodiments may be made of a positive or negative photosensitive resin material.

The above imaging panel can also be described in the following manners.

An imaging panel according to a first configuration includes an active matrix substrate having a pixel region provided with a plurality of pixels each including a photoelectric conversion element, in which the active matrix substrate includes, in each of the pixels, a first electrode provided at a first surface of the photoelectric conversion element, a first flattening film provided above the photoelectric conversion element and the first electrode, and a bias conductive part connected to the first electrode and configured to apply bias voltage to the first electrode, the bias conductive part is provided below the first flattening film, and the first flattening film has no opening disposed in a region overlapped with the pixel region in a planar view.

In the active matrix substrate including the photoelectric conversion element disposed in each of the pixels in the pixel region according to the first configuration, the first electrode provided at the first surface of the photoelectric conversion element is connected to the bias conductive part and receives the bias voltage via the bias conductive part. The bias conductive part is provided below the first flattening film that is provided above the photoelectric conversion element and the first electrode, and the first flattening film has no opening in the region overlapped with the pixel region. The bias conductive part and the first electrode are connected to each other without any opening such as a contact hole provided in the first flattening film disposed in the pixel region. In another exemplary case where the bias conductive part is provided above the first flattening film, the first flattening film needs to have a contact hole allowing connection between the bias conductive part and the first electrode. Moisture is likely to enter the photoelectric conversion element via the contact hole provided in the first flattening film in this case. The first configuration has no opening such as a contact hole in the first flattening film to be less likely to allow moisture to enter the photoelectric conversion element.

Optionally, in the first configuration, the active matrix substrate further includes a first insulating film covering the first electrode and a surface of the photoelectric conversion element, and a second flattening film provided below the photoelectric conversion element, the bias conductive part includes a bias line provided below the second flattening film and a bias electrode connecting the bias line and the first electrode, the bias electrode is provided, above part of the first insulating film, between the first insulating film and the first flattening film, the first insulating film has a first contact hole allowing connection between the bias electrode and the first electrode, and the second flattening film has a second contact hole allowing connection between the bias electrode and the bias line and positioned not to be overlapped with the photoelectric conversion element in a planar view (a second configuration).

According to the second configuration, the first insulating film covers the first electrode and the surface of the photoelectric conversion element, and the second flattening film is provided below the photoelectric conversion element. The bias conductive part includes the bias electrode provided between the first insulating film and the first flattening film, and the bias line provided below the second flattening film. The bias electrode and the first electrode are connected to each other via the first contact hole provided in the first insulating film, whereas the bias electrode and the bias line are connected to each other via the second contact hole provided in the second flattening film. The contact holes allowing connection between the bias electrode and the first electrode as well as connection between the bias electrode and the bias line are provided below the first flattening film. Even in a case where moisture permeates the first flattening film, the moisture is less likely to enter the photoelectric conversion element.

Optionally, in the first configuration, the active matrix substrate further includes a second electrode provided at a surface opposite to the first surface of the photoelectric conversion element, a first insulating film covering the first electrode and the surface of the photoelectric conversion element, and a second insulating film provided below the second electrode, the bias conductive part includes a bias line provided below the second insulating film and a bias electrode connecting the bias line and the first electrode, the bias electrode is provided, above part of the first insulating film, between the first insulating film and the first flattening film, the first insulating film has a first contact hole allowing connection between the bias electrode and the first electrode, and the second insulating film has a second contact hole allowing connection between the bias line and the bias electrode (a third configuration).

According to the third configuration, the second electrode is provided at the surface, not provided with the first electrode, of the photoelectric conversion element, and the second insulating film is provided below the second electrode. The first insulating film covers the first electrode and the surface of the photoelectric conversion element. The bias conductive part includes the bias electrode provided, above part of the first insulating film, between the first insulating film and the first flattening film, and the bias line provided below the second insulating film. The bias electrode and the first electrode are connected to each other via the first contact hole provided in the first insulating film, whereas the bias electrode and the bias line are connected to each other via the second contact hole provided in the second insulating film. The contact holes allowing connection between the bias electrode and the first electrode as well as connection between the bias electrode and the bias line are provided below the first flattening film. Even in a case where moisture permeates the first flattening film, the moisture is less likely to enter the photoelectric conversion element.

Optionally, in the second or third configuration, the active matrix substrate further includes a third insulating film covering the first insulating film and the bias electrode, and the third insulating film is covered with the first flattening film (a fourth configuration).

According to the fourth configuration, the third insulating film covers the first insulating film and the bias electrode, and first flattening film covers the third insulating film. The photoelectric conversion element is accordingly covered with the first insulating film and the third insulating film. In comparison to a case where the third insulating film is not provided, this configuration more effectively decreases entry of moisture to the photoelectric conversion element even upon permeation of moisture to the first flattening film.

In the second or third configuration, the bias electrode may be provided above the first insulating film at least covering the surface of the photoelectric conversion element (a fifth configuration).

According to the fifth configuration, the bias electrode covers the first insulating film disposed above the photoelectric conversion element. In comparison to a case where the bias electrode partially uncovers the first insulating film above the photoelectric conversion element, this configuration more effectively decreases entry of moisture to the photoelectric conversion element (a sixth configuration).

In any one of the second to fifth configurations, the active matrix substrate may further include an organic insulating film provided between, in a planar view, the first insulating film disposed on at least one of side surfaces of the photoelectric conversion element and the bias electrode.

According to the sixth configuration, the first insulating film and the organic insulating film cover at least one of the side surfaces of the photoelectric conversion element, and the bias electrode is overlapped with the organic insulating film. Provision of the organic insulating film enables separation between the photoelectric conversion element and the bias electrode for prevention of an electric short circuit between the photoelectric conversion element and the bias electrode.

In any one of the first to fifth configurations, the imaging panel may further include a scintillator provided at a surface of the active matrix substrate and configured to convert X-rays to scintillation light (a seventh configuration).

The seventh configuration decreases entry of moisture to the photoelectric conversion element in the active matrix substrate, to reduce leakage current of the photoelectric conversion element and improve X-ray detection accuracy.

The invention claimed is:

1. An imaging panel comprising an active matrix substrate having a pixel region provided with a plurality of pixels each including a photoelectric conversion element, wherein
the active matrix substrate includes, in each of the pixels,
a first electrode provided at a first surface of the photoelectric conversion element,
a first flattening film provided above the photoelectric conversion element and the first electrode, and
a bias conductive part including a bias electrode and a bias line, the bias electrode being connected to the first electrode and the bias line being configured to apply bias voltage to the first electrode via the bias electrode,
the bias electrode is provided below the first flattening film,
the bias line is provided below the first flattening film and the photoelectric conversion element, and
the first flattening film has no opening disposed in a region overlapped with the pixel region in a planar view.

2. The imaging panel according to claim 1, further comprising a scintillator provided at a surface of the active matrix substrate and configured to convert X-rays to scintillation light.

3. An imaging panel comprising an active matrix substrate having a pixel region provided with a plurality of pixels each including a photoelectric conversion element, wherein
the active matrix substrate includes, in each of the pixels,
a first electrode provided at a first surface of the photoelectric conversion element,
a first flattening film provided above the photoelectric conversion element and the first electrode, and
a bias conductive part connected to the first electrode and configured to apply bias voltage to the first electrode,
the bias conductive part is provided below the first flattening film,
the first flattening film has no opening disposed in a region overlapped with the pixel region in a planar view,
the active matrix substrate further includes
a first insulating film covering the first electrode and a surface of the photoelectric conversion element, and
a second flattening film provided below the photoelectric conversion element,
the bias conductive part includes a bias line provided below the second flattening film and a bias electrode connecting the bias line and the first electrode,
the bias electrode is provided, above part of the first insulating film, between the first insulating film and the first flattening film, the first insulating film has a first contact hole allowing connection between the bias electrode and the first electrode, and the second flattening film has a second contact hole allowing connection between the bias electrode and the bias line and positioned not to be overlapped with the photoelectric conversion element in a planar view.

4. The imaging panel according to claim 3, wherein the active matrix substrate further includes a third insulating film covering the first insulating film and the bias electrode, and the third insulating film is covered with the first flattening film.

5. The imaging panel according to claim 3, wherein the bias electrode is provided above the first insulating film at least covering the surface of the photoelectric conversion element.

6. The imaging panel according to claim 3, wherein the active matrix substrate further includes an organic insulating film provided between, in a planar view, the first insulating film disposed on at least one of side surfaces of the photoelectric conversion element and the bias electrode.

7. An imaging panel comprising an active matrix substrate having a pixel region provided with a plurality of pixels each including a photoelectric conversion element, wherein the active matrix substrate includes, in each of the pixels, a first electrode provided at a first surface of the photoelectric conversion element, a first flattening film provided above the photoelectric conversion element and the first electrode, and a bias conductive part connected to the first electrode and configured to apply bias voltage to the first electrode, the bias conductive part is provided below the first flattening film, the first flattening film has no opening disposed in a region overlapped with the pixel region in a planar view, the active matrix substrate further includes a second electrode provided at a surface opposite to the first surface of the photoelectric conversion element, a first insulating film covering the first electrode and the surface of the photoelectric conversion element, and a second insulating film provided below the second electrode, the bias conductive part includes a bias line provided below the second insulating film and a bias electrode connecting the bias line and the first electrode, the bias electrode is provided, above part of the first insulating film, between the first insulating film and the first flattening film, the first insulating film has a first contact hole allowing connection between the bias electrode and the first electrode, and the second insulating film has a second contact hole allowing connection between the bias line and the bias electrode.

* * * * *